US010629785B2

(12) United States Patent
Oyamada

(10) Patent No.: US 10,629,785 B2
(45) Date of Patent: Apr. 21, 2020

(54) LIGHT-EMITTING DEVICE

(71) Applicants: CITIZEN ELECTRONICS CO., LTD., Fujiyoshida-shi, Yamanashi (JP); CITIZEN WATCH CO., LTD., Nishitokyo-shi, Tokyo (JP)

(72) Inventor: Nodoka Oyamada, Fujiyoshida (JP)

(73) Assignees: CITIZEN ELECTRONICS CO., LTD., Fujiyoshida-Shi, Yamanashi (JP); CITIZEN WATCH CO., LTD, Nishitokyo-Shi, Tokyo (JP)

(*) Notice: Subject to any disclaimer, the term of this patent is extended or adjusted under 35 U.S.C. 154(b) by 0 days.

(21) Appl. No.: 16/107,926

(22) Filed: Aug. 21, 2018

(65) Prior Publication Data

US 2019/0058092 A1  Feb. 21, 2019

(30) Foreign Application Priority Data

Aug. 21, 2017 (JP) ................. 2017-158694

(51) Int. Cl.
*H01L 33/50* (2010.01)
*H01L 33/62* (2010.01)
(Continued)

(52) U.S. Cl.
CPC .......... *H01L 33/504* (2013.01); *H01L 33/507* (2013.01); *H01L 33/508* (2013.01);
(Continued)

(58) Field of Classification Search
None
See application file for complete search history.

(56) References Cited

U.S. PATENT DOCUMENTS

2006/0226759 A1* 10/2006 Masuda ............ C09K 11/0883
313/486
2012/0089180 A1* 4/2012 Fathi .................... B41J 2/17559
606/214
(Continued)

FOREIGN PATENT DOCUMENTS

JP  2005-277127 A  10/2005
JP  2015-046579 A  3/2015
(Continued)

*Primary Examiner* — Michelle Mandala
(74) *Attorney, Agent, or Firm* — Procopio, Cory, Hargreaves & Savitch LLP

(57) ABSTRACT

Provided is a light-emitting device including a mount board, an LED element mounted on the mount board, and a translucent or transparent sealing resin being filled onto the mount board to seal the LED element. The sealing resin contains first and second particulate phosphors excited by emitted light from the LED element, and a nanoscale filler having an average particle size in the range of 1 nm to 100 nm. The specific gravity of the first particulate phosphor is smaller than that of the second particulate phosphor. The sealing resin includes a dispersion layer of the first particulate phosphor covering areas obliquely above and beside the LED element, and a deposition layer of the second particulate phosphor on upper surfaces of the mount board and the LED element. The first particulate phosphor is dispersed in the dispersion layer among aggregates formed by particles of the nanoscale filler.

9 Claims, 3 Drawing Sheets

(51) Int. Cl.
*H01L 33/56* (2010.01)
*H01L 33/32* (2010.01)

(52) U.S. Cl.
CPC .............. *H01L 33/56* (2013.01); *H01L 33/62* (2013.01); *H01L 33/32* (2013.01); *H01L 2933/0041* (2013.01); *H01L 2933/0091* (2013.01)

(56) References Cited

U.S. PATENT DOCUMENTS

| | | |
|---|---|---|
| 2012/0112623 A1 | 5/2012 | Kobashi |
| 2013/0062648 A1* | 3/2013 | Nishimura ............ H01L 33/504 257/98 |
| 2013/0169149 A1 | 7/2013 | Sato et al. |
| 2016/0126428 A1* | 5/2016 | Hosokawa ............ H01L 33/502 257/98 |
| 2016/0233396 A1 | 8/2016 | Ota et al. |
| 2016/0268485 A1* | 9/2016 | Morimura ............. H01L 33/504 |
| 2017/0084502 A1* | 3/2017 | Kim ........................ H01L 22/24 |
| 2017/0186921 A1* | 6/2017 | Kim ...................... H01L 33/504 |

FOREIGN PATENT DOCUMENTS

| | | |
|---|---|---|
| JP | 2016-026404 A | 2/2016 |
| JP | 2016-082212 A | 5/2016 |
| WO | 2012/029695 A1 | 3/2012 |

* cited by examiner

LIGHT-EMITTING DEVICE

CROSS REFERENCE TO RELATED APPLICATION

This application claims the benefit of Japanese Patent Application JP2017-158694, filed on Aug. 21, 2017. The disclosure of JP2017-158694 is herein incorporated by reference.

TECHNICAL FIELD OF THE INVENTION

The present invention relates to a light-emitting device.

BACKGROUND OF THE INVENTION

Light-emitting devices (LED packages) are known in which a light-emitting diode (LED) device is mounted on a substrate and sealed with a translucent sealing resin containing a phosphor. In such a light-emitting device, light emitted from the LED element is mixed with light generated by exciting the phosphor with the emitted light, thereby producing light of a desired color, such as white, according to the purpose.

SUMMARY OF THE INVENTION

The phosphor in the sealing resin generates heat when excited by light from the LED element. Thus, the phosphor dispersed in the sealing resin raises the temperature of the sealing resin when the device emits light, which reduces the life span of the sealing resin and the light-emitting efficiency of the LED element. Therefore, during the manufacture of the light-emitting device, it is desirable to cure the sealing resin after the phosphor is naturally deposited in the sealing resin, and thereby to arrange the phosphor close to the mount board of the LED element, so that the heat from the phosphor can be easily discharged toward the mount board.

However, if the phosphor is completely deposited in the sealing resin, the phosphor layer is unlikely to cover areas beside and obliquely above (i.e., areas around the upper surface of) the LED element, although the phosphor is accumulated on the upper surfaces of the mount board and LED element. In this case, since light emitted obliquely upward from the LED element is subjected to insufficient wavelength conversion of the phosphor, the color corresponding to the emission wavelength of the LED element is conspicuous obliquely above the LED element, which leads to color unevenness on the light-emitting surface of the light-emitting device (in other words, the emitted light has angle directivity in chromaticity).

In order to prevent both overheating of the sealing resin and color unevenness of the light-emitting surface, it is desirable to realize an intermediate state between dispersion and deposition of the phosphor in the sealing resin. The deposition of the phosphor is realized by keeping the device still for several hours, for example, with the sealing resin kept uncured during the manufacture of the light-emitting device. It is thus conceivable, theoretically, that curing the sealing resin in the middle of sinking of the phosphor leads to the intermediate state. However, making the phosphor sink for only a short time to realize the intermediate state causes large variations between products, and hinders constantly manufacturing products having the same characteristics. Thus, curing the sealing resin in the middle of sinking of the phosphor is not a realistic way.

It is an object of the present invention to provide a light-emitting device which can be manufactured without lowering yields, can easily discharge heat generated by a phosphor for converting the wavelength of light from an LED element, through a mount board, and hardly has angle directivity in chromaticity of the emitted light.

Provided is a light-emitting device including a mount board, an LED element mounted on the mount board, and a translucent or transparent sealing resin being filled onto the mount board to seal the LED element. The sealing resin contains first and second particulate phosphors excited by emitted light from the LED element, and a nanoscale filler having an average particle size in the range of 1 nm to 100 nm. The specific gravity of the first particulate phosphor is smaller than that of the second particulate phosphor. The sealing resin includes a dispersion layer of the first particulate phosphor covering areas obliquely above and beside the LED element, and a deposition layer of the second particulate phosphor on upper surfaces of the mount board and the LED element. The first particulate phosphor is dispersed in the dispersion layer among aggregates formed by particles of the nanoscale filler.

Preferably, in the light-emitting device, the median of the grain-size distribution of the first particulate phosphor is smaller than that of the second particulate phosphor.

Preferably, in the light-emitting device, the LED element generates blue light as the emitted light, the first particulate phosphor is excited by the emitted light to generate red light, and the second particulate phosphor is excited by the emitted light to generate green or yellow light.

BRIEF DESCRIPTION OF THE DRAWINGS

Other features and advantages of the present invention will be apparent from the ensuing description, taken in conjunction with the accompanying drawings, in which.

DESCRIPTION OF EMBODIMENTS

Hereinafter, with reference to the accompanying drawings, a light-emitting device will be explained in detail. However, it should be noted that the present invention is not limited to the drawings or the embodiments described below.

Figure 1A:
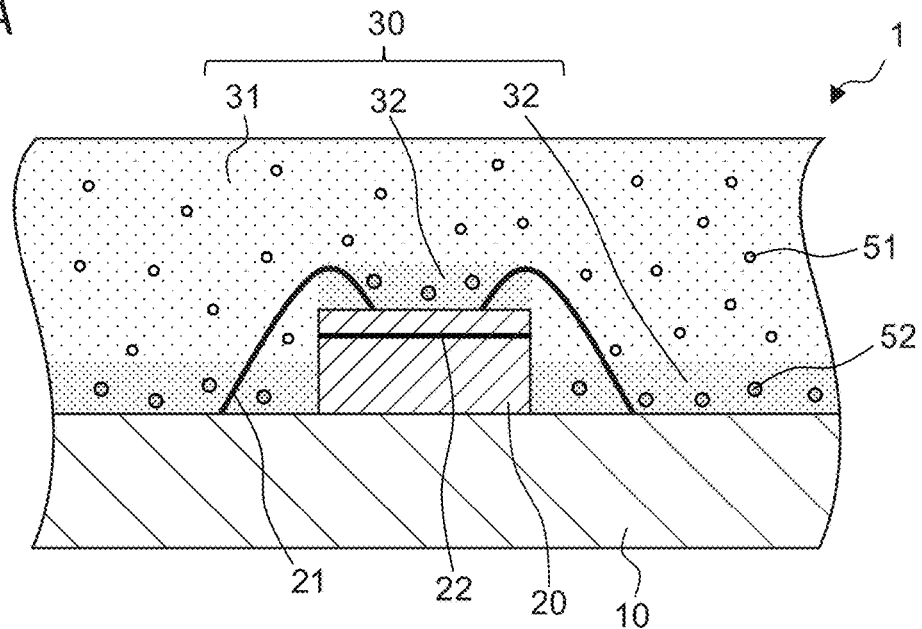
FIGS. 1A and 1B are a cross-sectional view and a top view of a light-emitting device 1, respectively.
Figure 1B:
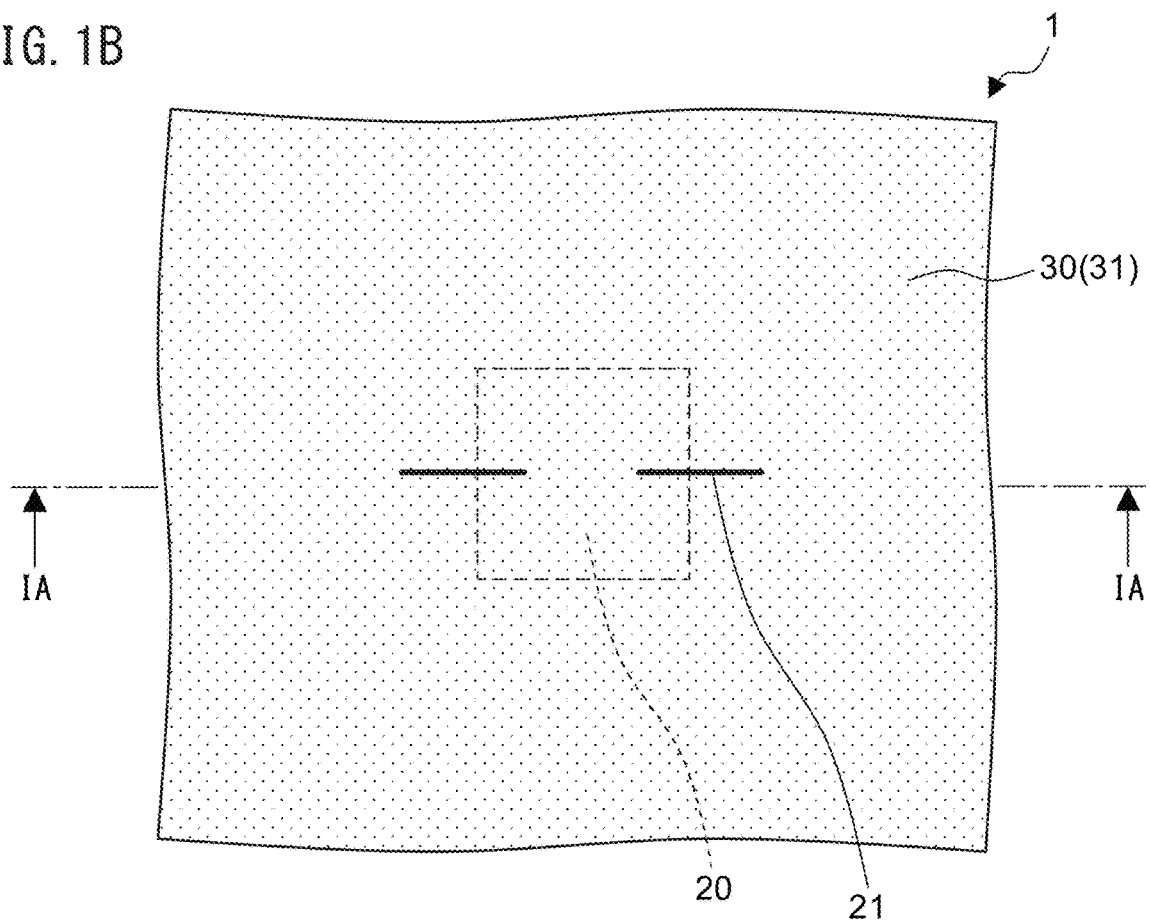

FIGS. 1A and 1B are a cross-sectional view and a top view of a light-emitting device 1, respectively. FIG. 1A shows a cross section of the light-emitting device 1 taken along line IA-IA in FIG. 1B. The light-emitting device 1 is a device (LED package) which includes an LED element as a light-emitting element and utilizes wavelength conversion of a phosphor for emitting white light, and is used as an LED light source for various kinds of applications, such as lighting equipment, floodlighting and illumination. The light-emitting device 1 includes, as its major components, a mount board 10, an LED element 20 and a sealing resin 30. The number of LED elements 20 is not limited to one, and the light-emitting device 1 may be a Chip-On-Board (COB) light-emitting apparatus including multiple LED elements 20 mounted on a single mount board 10.

The mount board 10 is a substrate including two connecting electrodes for electrically connecting the LED element 20 to an external power source, and has an upper surface on which the LED element 20 is mounted. For example, the mount board 10 may be a ceramic substrate, or a substrate constructed by bonding a metal board made of aluminum or copper, which excels in heat resistance and heat dissipation, to an insulating circuit board on which conductive patterns and connecting electrodes are formed for the LED element 20. Alternatively, the mount board 10 may be a base of an LED package including two lead electrodes for electrically connecting the LED element 20 to an external power source and a concave portion in which the LED element 20 is mounted and the sealing resin 30 is filled.

The LED element 20 is a light-emitting element made of a gallium nitride compound semiconductor which emits light having a wavelength in the ultraviolet to blue regions, for example. The LED element 20 is a blue LED element which emits, as the emitted light, blue light having a wavelength in the range of about 450 to 460 nm, for example, but may be an element which emits light having another wavelength. The LED element 20 is die-bonded on the upper surface of the mount board 10, and has positive and negative electrodes electrically connected to the connecting electrodes on the mount board 10 via two bonding wires (hereinafter, simply referred to as "wires") 21. If the light-emitting device includes multiple LED elements 20 connected in series, these LED elements 20 are also electrically connected via the wires 21 with each other. Note that it is not necessary to mount the LED element 20 by wire bonding; it may be mounted by flip-chip technology.

Figure 2A:
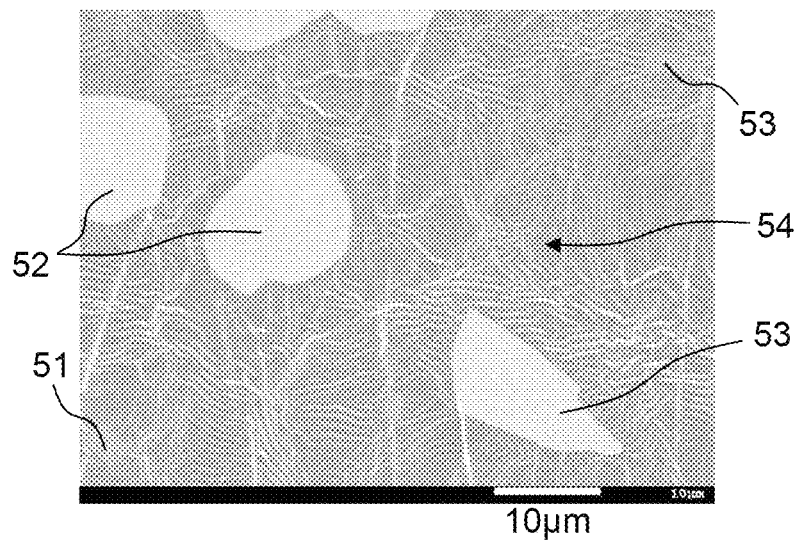
FIGS. 2A to 2C are enlarged photographs showing portions of the sealing resin 30 of the light-emitting device 1.
Figure 2B:
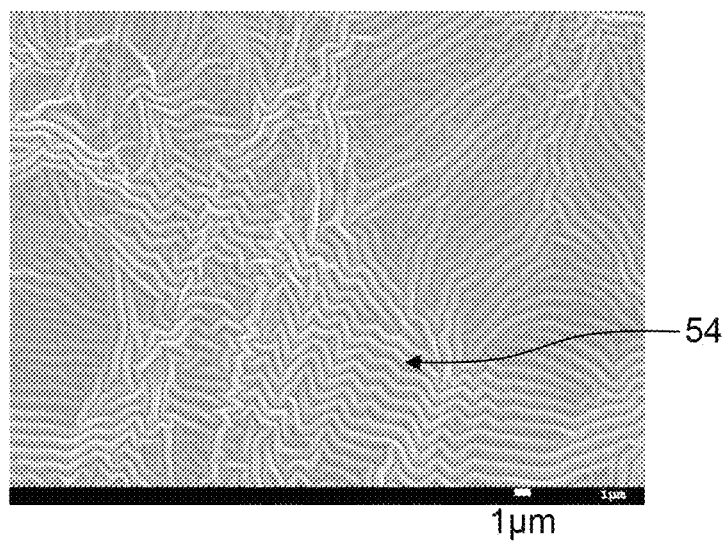
Figure 2C:
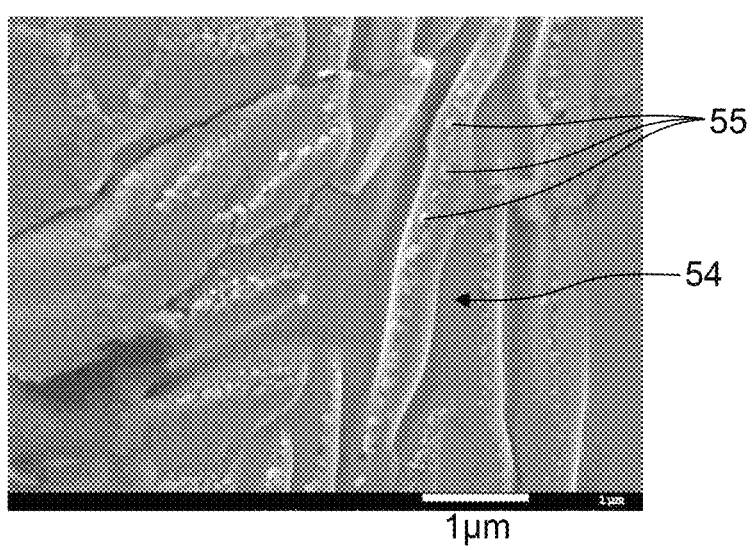

The sealing resin 30 is a translucent or transparent resin, such as an epoxy resin or a silicone resin, and is filled on the mount board 10 around the LED element 20 to collectively seal the LED element 20 and the wires 21. The sealing resin 30 contains a red phosphor, a yellow phosphor, a filler and a nanoscale filler (hereinafter, referred to as "nanofiller"). Of these, FIG. 1A shows only particles of the red phosphor 51 and the yellow phosphor 52, and the filler and nanofiller are omitted from illustration (these are shown in FIGS. 2A to 2C described later). The light-emitting device 1 may further include a resin frame which is a dam member preventing the sealing resin 30 from flowing out. In this case, the sealing resin 30 may be filled in the inside region surrounded by the frame to seal the LED element 20 and the wires 21.

The red phosphor, which is an example of the first particulate phosphor, is composed of $CaAlSiN_3:Eu^{2+}$, for example, and absorbs blue light from the LED element 20 and converts the wavelength thereof into that of red light. The yellow phosphor, which is an example of the second particulate phosphor, is composed of yttrium aluminum garnet (YAG), for example, and absorbs blue light from the LED element 20 and converts the wavelength thereof into that of yellow light. The light-emitting element 1 mixes the blue light from the LED element 20 and the yellow and red light from the yellow and red phosphors to emit white light.

For example, the specific gravity of the particulate red phosphor 51 is about 2 to 4 $g/cm^3$, and that of the particulate yellow phosphor 52 is about 5 to 7 $g/cm^3$. Thus, the specific gravity of the particulate red phosphor 51 is smaller than that of the particulate yellow phosphor 52. The median diameter D50 (median of the grain-size distribution) of the particulate red phosphor 51 is about 5 to 15 μm, and that of the particulate yellow phosphor 52 is about 18 to 30 μm. Thus, the median diameter D50 of the particulate red phosphor 51 is smaller than that of the particulate yellow phosphor 52.

Instead of the above-mentioned combination of phosphors, the sealing resin 30 may contain a red phosphor and a green phosphor, for example. The green phosphor, which is an example of the second particulate phosphor, is composed of $(BaSr)_2SiO_4:Eu^{2+}$ or lutetium aluminum garnet (LuAG), for example, and is excited by the blue light from the LED element 20 to generate green light. In this case also, the light-emitting device 1 mixes the blue light from the LED element 20 and the green and red light from the green and red phosphors to emit white light. Alternatively, the sealing resin 30 may contain more than two phosphors, such as red, yellow and green phosphors. The specific gravity and median diameter D50 of the green phosphor is substantially the same as those of the yellow phosphor. Thus, even if the sealing resin 30 contains the green phosphor instead of (alternatively, in addition to) the yellow phosphor, the specific gravity and median diameter D50 of the red phosphor is smaller than those of the green phosphor.

The filler contained in the sealing resin 30 is a micron-sized particulate inorganic material having an average particle size in the range of 1 to 100 μm. The filler functions as a scattering agent which scatters light in the sealing resin 30 to cause all the light-emitting region of the light-emitting device 1 composed of the LED element 20 and the sealing resin 30 to uniformly emit light. A material such as silicon dioxide (silica), alumina, titania, zirconia or magnesia may be used as the filler.

The nanofiller contained in the sealing resin 30 is a nano-sized particulate inorganic material having an average particle size (particle size of individual primary particles which are not aggregated) in the range of 1 to 100 nm. The nanofiller has the function of preventing a particulate phosphor having a small specific gravity from depositing (sinking) in the sealing resin 30. The filler and nanofiller have particle sizes different by about three orders, but may be the same material. A material such as silicon dioxide (silica), alumina, titania, zirconia or magnesia may be used as the nanofiller. It is preferred to use a material having heat resistance and easily adsorbing to a particulate phosphor, as the nanofiller.

FIGS. 2A to 2C are enlarged photographs showing portions of the sealing resin 30 of the light-emitting device 1. The photographs of FIGS. 2A to 2C are taken with 2000-fold, 3000-fold and 20000-fold magnifications, respectively. The lengths of the white lines shown at the bottom of FIGS. 2A to 2C correspond to 10 μm, 1 μm and 1 μm, respectively. FIGS. 2B and 2C are partial enlargements of FIGS. 2A and 2B, respectively.

Reference numerals 51 to 53 in FIG. 2A indicate particles of the red phosphor, yellow phosphor and filler, respectively. In FIG. 2A, these micron-sized particles mixed in the sealing resin 30 can be observed. The particles of the nanofiller cannot be seen in FIG. 2A, since the particle size thereof is smaller by about three orders than that of the phosphors and filler. However, a large number of particles of the nanofiller gather to form aggregates, which can be seen as striped patterns indicated by reference numeral 54. Reference numeral 55 in FIG. 2C indicates the particles of the nanofiller. If the density of the nanofiller is higher than a certain value, these aggregates are interlaced with each other to form a layered structure (mesh structure) in the sealing resin 30, as shown in FIGS. 2B and 2C. Therefore, it is conceivable that the red phosphor 51 having a small specific gravity is held in the sealing resin 30 by the mesh structure, and thus hardly sinks even after a certain time period from the filling of the uncured sealing resin 30.

As shown in FIG. 1A, the sealing resin 30 includes a dispersion layer 31 of the red phosphor 51 and a deposition layer 32 of the yellow phosphor 52, in this order from the side far from the mount board 10. In other words, in the sealing resin 30, the red phosphor 51 is dispersed, while the yellow phosphor 52 is deposited on the upper surfaces of the mount board 10 and the LED element 20.

The dispersion layer 31 is placed on the upper side of the deposition layer 32, and includes the red phosphor 51 dispersed at a substantially uniform density, together with the particles of the filler and nanofiller. As described above, the particles 55 of the nanofiller form the aggregates 54 in the sealing resin 30, and the red phosphor 51 has a relatively small specific gravity, and is thus held and dispersed among the aggregates, without sinking. As shown in FIG. 1B, the dispersion layer 31 uniformly spreads on all sides of the LED element 20, and isotropically covers areas obliquely above and beside the light-emitting layer 22 (i.e., areas around the four sides of the upper surface) of the LED element 20. In the light-emitting device 1, the light-emitting layer 22 of the LED element 20 is surrounded by the red phosphor 51. Although there may be a difference in density of the red phosphor 51 in some places in the dispersion layer 31, in particular, the density difference in the thickness direction is so small that it can be substantially disregarded.

The deposition layer 32 is placed on the upper surface of the LED element 20 and on the upper surface of the mount board 10 around the LED element 20, and contains the yellow phosphor 52 at a density higher than that of the dispersion layer 31. In other words, the density of the yellow phosphor 52 in the sealing resin 30 rapidly increases toward the lower side of the sealing resin 30. In the sealing resin 30, the red phosphor 51 and the yellow phosphor 52 are mainly contained in the dispersion layer 31 and the deposition layer 32, respectively. Although some of the red phosphor 51 and some of the yellow phosphor 52 may be contained in the deposition layer 32 and the dispersion layer 31, respectively, their densities are so small that they can be disregarded.

When the light-emitting device 1 is manufactured, the LED element 20 is first die-bonded on the upper surface of the mount board 10, and then the positive and negative electrodes of the LED element 20 are connected to the connecting electrodes of the mount board 10 via bonding wires. Subsequently, the translucent or transparent sealing resin 30 containing a red phosphor, a yellow phosphor, a filler and a nanofiller is filled around the LED element 20 to seal the LED element 20 and the wire 21.

Then, after the sealing resin 30 is kept uncured for several hours, the red phosphor 51 having a small specific gravity remains dispersed in the sealing resin 30, while the yellow phosphor 52 having a large specific gravity is naturally deposited on the upper surfaces of the mount board 10 and the LED element 20. After the dispersion layer 31 of the red phosphor and the deposition layer 32 of the yellow phosphor are thus formed in the sealing resin 30, the sealing resin 30 is cured by heating, for example. In this way, the light-emitting device 1 shown in FIGS. 1A and 1B is completed, and thereafter, the dispersion of the red phosphor and the deposition of the yellow phosphor are kept unchanged.

Figure 3A:
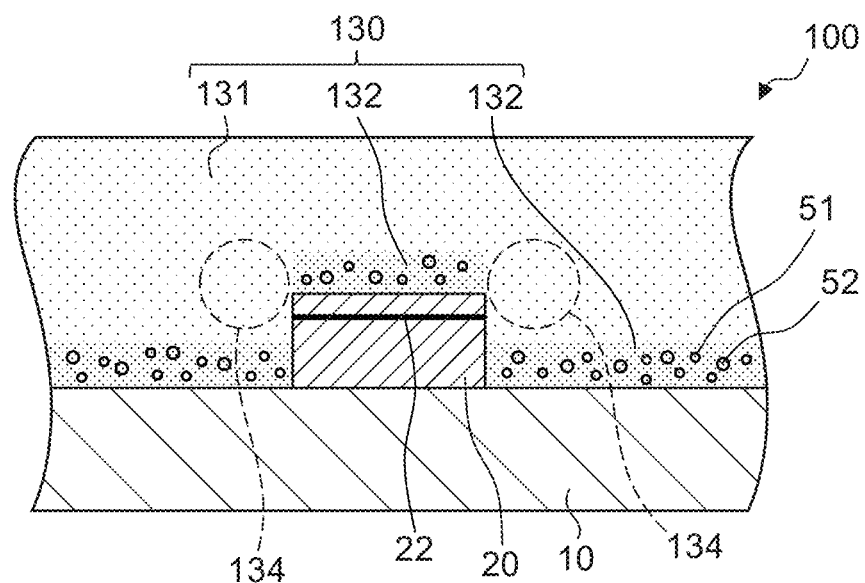
FIGS. 3A to 3C are cross-sectional views of the light-emitting device 1 and light-emitting devices 100 and 200 of comparative examples.
Figure 3B:
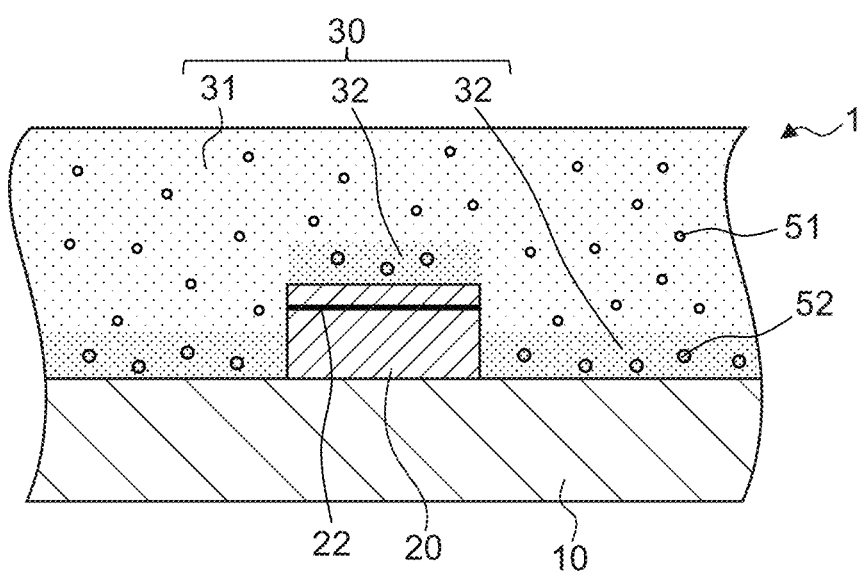
Figure 3C:
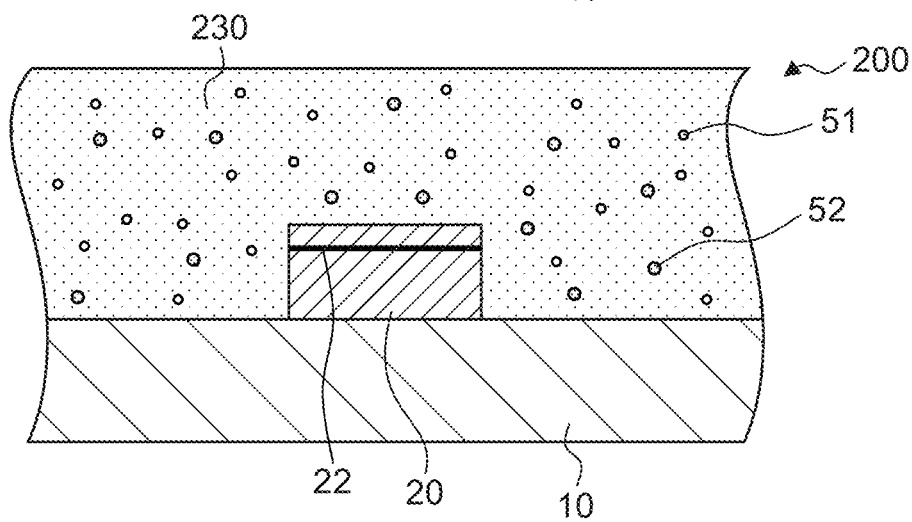

FIG. 3A is a cross-sectional view of a light-emitting device 100 of a comparative example in which the amount of nanofiller added to the sealing resin is 0.3 wt % or less. FIG. 3B is a cross-sectional view of the light-emitting device 1 in which the amount of nanofiller is 0.5 to 1.0 wt %, and this figure is the same as FIG. 1A. FIG. 3C is a cross-sectional view of a light-emitting device 200 of another comparative example in which the amount of nanofiller is 1.0 wt % or more. The light-emitting devices 100 and 200 are identical in structure to the light-emitting device 1, except for the amount of nanofiller added to the sealing resin (silicone resin), and the degree of deposition of the yellow and red phosphors depending on the amount of nanofiller. For simplicity, bonding wires are omitted from illustration in FIGS. 3A to 3C.

In the light-emitting device 100 of FIG. 3A, both the red phosphor 51 and the yellow phosphor 52 are deposited (completely deposited) in the sealing resin 130 on the upper surfaces of the mount board 10 and the LED element 20, and thus there is no dispersion layer of phosphors. The sealing resin 130 of the light-emitting device 100 includes a deposition layer 132 of the yellow and red phosphors on the upper surfaces of the mount board 10 and the LED element 20, and a resin layer 131 which substantially does not contain any particulate phosphor, on the upper side of the deposition layer 132. In the light-emitting device 100, as indicated by broken lines 134 in FIG. 3A, the deposition layer 132 of phosphors is not formed around the upper surface of (i.e., beside the light-emitting layer 22 of) the LED element 20. Thus, in the light-emitting device 100, light emitted obliquely upward from the LED element 20 is subjected to insufficient wavelength conversion of the phosphors as described above, and thus color unevenness may be conspicuous.

In the light-emitting device 200 of FIG. 3C, both the red phosphor 51 and the yellow phosphor 52 are uniformly dispersed (completely dispersed) in the sealing resin 230, and thus there is no deposition layer of phosphors. The state of the sealing resin 230 of the light-emitting device 200 is the same as that of the uncured sealing resin 30 immediately after the filling during the manufacture of the light-emitting device 1. Since all the phosphors remain dispersed in the sealing resin, the light-emitting device 200 has poor heat dissipation characteristics and the temperature of the sealing resin may rise too high when the device emits light, as described above.

In the sealing resin 30 of the light-emitting device 1 of FIG. 3B, the red phosphor 51 is dispersed, while the yellow phosphor 52 is deposited, as described above; and thus an intermediate state is realized in which the complete deposition in the light-emitting device 100 and the complete dispersion in the light-emitting device 200 are mixed. Appropriately adjusting the amount of nanofiller allows for maintaining such a state in which only the yellow phosphor having a large specific gravity is deposited and the red phosphor having a small specific gravity is dispersed. Thus, in the light-emitting device 1, the phosphors having a difference in specific gravity are not completely deposited even after a certain time period, and are separated in the sealing resin 30 to form a thin phosphor layer covering areas obliquely above the LED element 20. In general, the specific gravity of the yellow and green phosphors is larger than that of red phosphor, and thus, even if the green phosphor is used instead of the yellow phosphor (alternatively, in addition to the red and yellow phosphors), it is possible to make the green phosphor be deposited, similarly to the yellow phosphor, while the red phosphor remains dispersed.

In the light-emitting device 1, the phosphors are not completely deposited, and the dispersion layer 31 of the red phosphor also covers areas obliquely above the LED element 20. Thus, light emitted obliquely upward from the LED element 20 is also subjected to the wavelength conversion of the red phosphor in the sealing resin 30, similarly to light emitted in other directions. Accordingly, in the light-emitting device 1, the emitted light is unlikely to have angle directivity in chromaticity, and color unevenness on the light-emitting surface is unlikely to occur. Further, in the light-emitting device 1, since the deposition layer 32 of the yellow phosphor 52 is in contact with the mount board 10, heat generated by the yellow phosphor is easily discharged toward the mount board 10, and thus overheating of the sealing resin 30 is also unlikely to occur.

If the density of the nanofiller in each sealing resin 30 is the same, the same deposition state is realized in all products in the end after the uncured sealing resin 30 is filled, and this state is not changed even after a certain time period. Thus, in the light-emitting device 1, the variations of chromaticity between products are reduced and yields are improved, by curing the sealing resin 30 after the steady state shown in FIG. 3B is realized during the manufacture, as compared to the case where the sealing resin is cured in the middle of sinking of the phosphor without using the nanofiller. The light-emitting device 1 also has an advantage in that the hue of the emitted light is unlikely to deviate from the desired value, since the dispersed red phosphor prevents the red light from being absorbed by the other phosphor.

Even if the sealing resin 30 contains the nanofiller, when the density thereof is 0.3 wt % or less, the deposition state (complete deposition) is realized, which is the same as the state of the light-emitting device 100 shown in FIG. 3A. When the density of the nanofiller in the sealing resin 30 is above 1.0 wt %, even after a considerable time period, none of the phosphors are sufficiently deposited, and the dispersion state (complete dispersion) shown in FIG. 3C is maintained. As the density of the nanofiller in the sealing resin 30 increases, the phosphors are more difficult to sink.

Assume that a silicone resin, silicon dioxide, a phosphor having a specific gravity of 2 to 4 g/cm$^3$, and a phosphor having a specific gravity of 5 to 7 g/cm$^3$ are used as the sealing resin 30, nanofiller, red phosphor and yellow phosphor, respectively. In this case, if the amount of nanofiller is 0.5 to 1.0 wt %, the state shown in FIG. 3B is realized after the sealing resin 30 is kept uncured for several hours. Accordingly, it is preferred that the amount of nanofiller be in the range from 0.5 to 1.0 wt %, in light of the degree of color unevenness of emitted light and the heatproof temperature of the sealing resin 30. This preferred range is determined by the materials of the sealing resin, phosphor and nanofiller.

Containing the nanofiller at a certain density leads to the state shown in FIG. 3B, even if the kind and density of the filler are changed. Since the filler mainly functions as a scattering agent as described above, the sealing resin 30 does not necessarily contain any filler, in order to control the deposition of the particulate phosphors.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light-emitting device comprising:
a mount board;
an LED element mounted on the mount board; and
a translucent or transparent sealing resin being filled onto the mount board to seal the LED element, the sealing resin containing first and second particulate phosphors excited by emitted light from the LED element, and a nanoscale filler having an average particle size in the range of 1 nm to 100 nm, wherein
the specific gravity of the first particulate phosphor is smaller than that of the second particulate phosphor,
the sealing resin includes a dispersion layer of the first particulate phosphor covering areas obliquely above and beside the LED element, and a deposition layer of the second particulate phosphor on upper surfaces of the mount board and the LED element,
in the dispersion layer, particles of the nanoscale filler form aggregates which have a mesh structure,
the first particulate phosphor is dispersed in the dispersion layer by being held in the mesh structure,
the dispersion layer is thicker than the deposition layer, and
a density of the first particulate phosphor is substantially uniform in the dispersion layer such that any difference in the density of the first particulate phosphor is small enough to be disregarded.

2. The light-emitting device according to claim 1, wherein the median of the grain-size distribution of the first particulate phosphor is smaller than that of the second particulate phosphor.

3. The light-emitting device according to claim 1, wherein the LED element generates blue light as the emitted light, the first particulate phosphor is excited by the emitted light to generate red light, and
the second particulate phosphor is excited by the emitted light to generate green light.

4. The light-emitting device according to claim 1, wherein the LED element generates blue light as the emitted light, the first particulate phosphor is excited by the emitted light to generate red light, and
the second particulate phosphor is excited by the emitted light to generate yellow light.

5. The light-emitting device according to claim 1, wherein the light-emitting device does not comprise another resin layer on an upper surface of the dispersion layer, the upper surface of the dispersion layer being a light-emitting surface of the light-emitting device.

6. The light-emitting device according to claim 1, wherein the density of the first particulate phosphor in the dispersion layer is lower than that of the second particulate phosphor in the deposition layer.

7. The light-emitting device according to claim 1, wherein, after being filled onto the mount board, the sealing resin is kept uncured for an amount of time such that the second particulate phosphors sink in the sealing resin and are naturally deposited on the upper surface of the mount board forming the deposition later, while the first particulate phosphor are held in the mesh structure forming the dispersion layer.

8. The light-emitting device according to claim 1, wherein the nanoscale filler comprises a density that is between than 0.3 wt % and 1.0 wt %.

9. The light-emitting device according to claim 8, wherein the density of the nanoscale filler is greater than 0.5 wt %.

* * * * *